US009768127B2

United States Patent
Nakamura

(10) Patent No.: US 9,768,127 B2
(45) Date of Patent: Sep. 19, 2017

(54) WAFER PROCESSING METHOD

(71) Applicant: DISCO CORPORATION, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/398,274

(22) Filed: Jan. 4, 2017

(65) Prior Publication Data

US 2017/0207181 A1    Jul. 20, 2017

(30) Foreign Application Priority Data

Jan. 19, 2016    (JP) .................. 2016-007826

(51) Int. Cl.
  *H01L 21/00*    (2006.01)
  *H01L 23/00*    (2006.01)
  *H01L 23/544*    (2006.01)
  *H01L 21/78*    (2006.01)
  *H01L 21/268*    (2006.01)
  *H01L 21/304*    (2006.01)

(52) U.S. Cl.
  CPC .......... *H01L 23/562* (2013.01); *H01L 21/268* (2013.01); *H01L 21/304* (2013.01); *H01L 21/78* (2013.01); *H01L 23/544* (2013.01); *H01L 2223/5446* (2013.01)

(58) Field of Classification Search
  CPC ..... H01L 23/562; H01L 23/544; H01L 21/78; H01L 21/268; H01L 21/304
  See application file for complete search history.

(56) References Cited

U.S. PATENT DOCUMENTS

2005/0260829 A1*  11/2005  Uematsu ............ H01L 21/3043
                                                            438/460

FOREIGN PATENT DOCUMENTS

JP    2002-192370    7/2002
JP    2014-017287    1/2014

* cited by examiner

*Primary Examiner* — Richard Booth
(74) *Attorney, Agent, or Firm* — Greer Burns & Crain, Ltd.

(57) ABSTRACT

Disclosed herein is a wafer processing method including a first modified layer forming step of applying a laser beam having a transmission wavelength to a wafer from the back side thereof along each division line in the condition where the focal point of the laser beam is set inside the wafer near the front side thereof, thereby forming a first modified layer inside the wafer along each division line. The wafer processing method further includes a second modified layer forming step of applying the laser beam to the wafer from the back side thereof along each division line in the condition where the focal point of the laser beam is set adjacent to the first modified layer thereabove toward the back side of the wafer, thereby forming a second modified layer for growing a crack from the first modified layer toward the front side of the wafer.

3 Claims, 9 Drawing Sheets

WAFER PROCESSING METHOD

BACKGROUND OF THE INVENTION

Field of the Invention

The present invention relates to a wafer processing method for dividing a wafer into a plurality of individual device chips along a plurality of crossing division lines formed on the front side of the wafer, the front side of the wafer being partitioned by the division lines to define a plurality of separate regions where a plurality of devices are formed.

Description of the Related Art

In a semiconductor device fabrication process, a plurality of crossing division lines are formed on the front side of a substantially disk-shaped semiconductor wafer to thereby define a plurality of separate regions where a plurality of devices such as integrated circuits (ICs) and large-scale integrations (LSIs) are formed. The semiconductor wafer is cut along the division lines to thereby divide the regions where the devices are formed from each other, thus obtaining individual device chips.

As a method of dividing a wafer such as a semiconductor wafer along the division lines, there has been put into practical use a laser processing method called internal processing using a pulsed laser beam having a transmission wavelength to the wafer, wherein the pulsed laser beam is applied to the wafer in the condition where the focal point of the pulsed laser beam is set inside the wafer in an area to be divided. A wafer dividing method using this laser processing method includes the steps of applying a pulsed laser beam having a transmission wavelength to the wafer in the condition where the focal point of the pulsed laser beam is set inside the wafer, thereby continuously forming a modified layer inside the wafer along each division line, and next applying an external force to the wafer along each division line where the strength has been reduced by the formation of the modified layer, thereby dividing the wafer into the individual device chips (see Japanese Patent No. 3408805, for example).

As a method of applying an external force to the wafer, there is disclosed in Japanese Patent Laid-open No. 2014-17287 a technique including the steps of attaching a protective tape to the front side of the wafer and grinding the back side of the wafer to reduce the thickness of the wafer to a predetermined thickness and simultaneously apply an external force due to grinding to the wafer, so that the wafer is divided into the individual device chips along each division line where the modified layer is formed.

SUMMARY OF THE INVENTION

However, in the case of adopting the laser processing method mentioned above to continuously form the modified layer inside the wafer along each division line and next reliably divide the wafer along each division line, it is necessary to form a plurality of modified layers in a stacked manner inside the wafer along each division line.

Referring to FIG. 10, a first modified layer B1 is initially formed inside a wafer W near the lower surface (front side) of the wafer W, and a second modified layer B2 is next formed directly above the first modified layer B1 toward the upper surface (back side) of the wafer W. In forming the second modified layer B2, cracks C grow in random directions from the first modified layer B1 toward the lower surface (front side) of the wafer W. Accordingly, when an external force is applied to the wafer W to divide the wafer W into the individual device chips, there arises a problem such that a breaking line formed by the cracks and exposed to the front side of the wafer W may meander to cause a reduction in quality of each device.

In particular, this problem becomes remarkable in the case of grinding the back side of the wafer to reduce the thickness of the wafer to a predetermined thickness and simultaneously applying an external force due to grinding to the wafer, thereby dividing the wafer into the individual device chips along each division line where the modified layer is formed.

It is therefore an object of the present invention to provide a wafer processing method which can suppress meandering of the breaking line by defining the direction of extension of a crack growing from the first modified layer toward the front side of the wafer in the case of forming a plurality of modified layers in a stacked manner inside the wafer along each division line to divide the wafer along each division line.

In accordance with an aspect of the present invention, there is provided a wafer processing method for dividing a wafer into a plurality of individual device chips along a plurality of crossing division lines formed on the front side of the wafer, the front side of the wafer being partitioned by the division lines to define a plurality of separate regions where a plurality of devices are formed, the individual device chips corresponding to the respective devices, the wafer processing method including a first modified layer forming step of applying a laser beam having a transmission wavelength to the wafer from the back side thereof along each division line in the condition where the focal point of the laser beam is set inside the wafer near the front side thereof, thereby forming a first modified layer inside the wafer along each division line; and a second modified layer forming step of applying the laser beam to the wafer from the back side thereof along each division line in the condition where the focal point of the laser beam is set adjacent to the first modified layer thereabove toward the back side of the wafer after performing the first modified layer forming step, thereby forming a second modified layer for growing a crack from the first modified layer toward the front side of the wafer; wherein the focal point of the laser beam in the second modified layer forming step is set at a position slightly displaced by a predetermined offset amount from the position directly above the first modified layer in a Y direction perpendicular to an X direction corresponding to the scanning direction of the laser beam, thereby defining the direction of extension of the crack growing from the first modified layer toward the front side of the wafer.

Preferably, the wafer processing method further includes a back grinding step of grinding the back side of the wafer in the condition where a protective member is attached to the front side of the wafer, after performing the second modified layer forming step, thereby reducing the thickness of the wafer to a predetermined thickness and simultaneously dividing the wafer into the individual device chips. Preferably, the offset amount is set to 6 to 8 μm.

According to the wafer processing method of the present invention, the second modified layer forming step is performed to apply the laser beam to the wafer from the back side thereof along each division line in the condition where the focal point of the laser beam is set at a position slightly displaced in the Y direction by the predetermined offset amount from the position directly above the first modified layer, thereby forming the second modified layer at this offset position. Accordingly, the direction of extension of the crack growing from the first modified layer toward the front side of the wafer can be defined to thereby suppress meandering of a breaking line formed along the crack and exposed to the front side of the wafer.

Accordingly, in forming a plurality of modified layers in a stacked manner inside the wafer along each division line, there is no possibility that cracks may grow in random directions from the first modified layer toward the front side of the wafer. As a result, it is possible to solve the problem that when an external force is applied to the wafer to thereby divide the wafer into the individual device chips, the breaking line exposed to the front side of the wafer may meander to cause a reduction in quality of each device.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
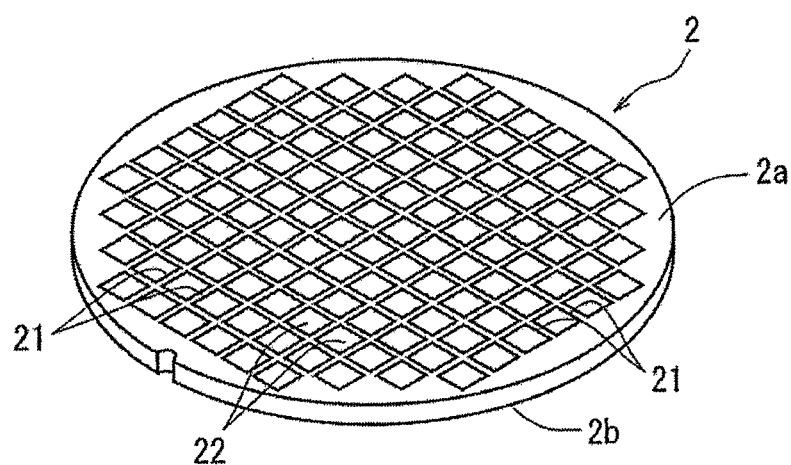
FIG. 1 is a perspective view of a semiconductor wafer as viewed from the front side thereof.

A preferred embodiment of the wafer processing method according to the present invention will now be described in detail with reference to the attached drawings. Referring to FIG. 1, there is shown a perspective view of a semiconductor wafer 2 to be processed by the wafer processing method according to the present invention. The semiconductor wafer 2 shown in FIG. 1 is a silicon wafer having a thickness of 700 μm, for example. The semiconductor wafer 2 has a front side 2a and a back side 2b. A plurality of crossing division lines (streets) 21 are formed on the front side 2a of the semiconductor wafer 2 to thereby define a plurality of separate regions where a plurality of devices 22 such as ICs and LSIs are formed. There will now be described a wafer processing method for dividing the semiconductor wafer 2 into the individual devices (device chips) 22 along the division lines 21.

Figure 2A:
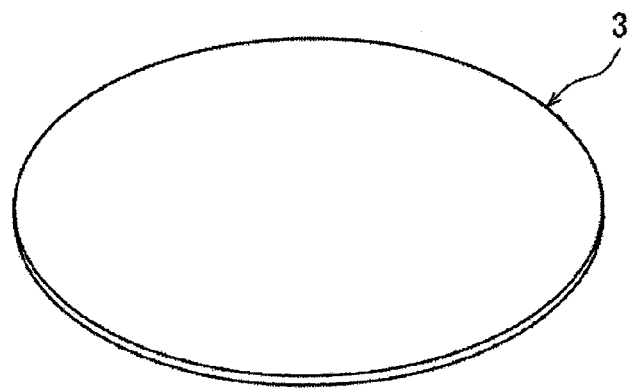
FIGS. 2A and 2B are perspective views showing a protective member attaching step.
Figure 2A:
Figure 2A:
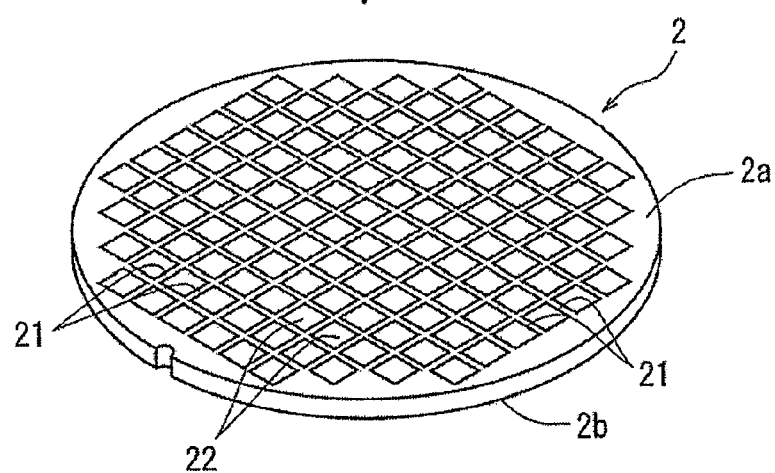
Figure 2B:
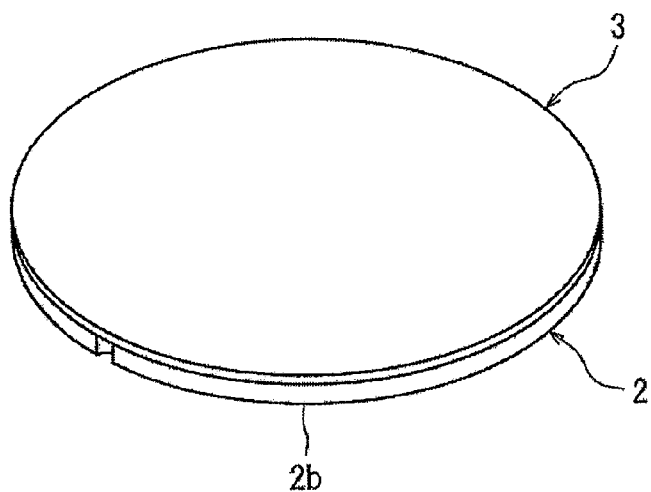

First, a protective member attaching step is performed in such a manner that a protective member is attached to the front side 2a of the semiconductor wafer 2, so as to protect the devices 22 formed on the front side 2a of the semiconductor wafer 2. More specifically, as shown in FIGS. 2A and 2B, a protective tape 3 as a protective member is attached to the front side 2a of the semiconductor wafer 2. In this preferred embodiment, the protective tape 3 is composed of a base sheet and an adhesive layer formed on the front side of the base sheet. For example, the base sheet is formed of polyvinyl chloride (PVC) and has a thickness of 100 μm, and the adhesive layer is formed of acrylic resin and has a thickness of approximately 5 μm.

After performing the protective member attaching step to attach the protective tape 3 to the front side 2a of the semiconductor wafer 2 as mentioned above, a first modified layer forming step is performed in such a manner that a laser beam having a transmission wavelength to the semiconductor wafer 2 is applied to the semiconductor wafer 2 from the back side 2b thereof along each division line 21 in the condition where the focal point of the laser beam is set inside the semiconductor wafer 2 near the front side 2a thereof, thereby forming a first modified layer inside the semiconductor wafer 2 along each division line 21. This first modified layer forming step is performed by using a laser processing apparatus 4 shown in FIG. 3. The laser processing apparatus 4 shown in FIG. 3 includes a chuck table 41 for holding a workpiece, laser beam applying means 42 for applying a laser beam to the workpiece held on the chuck table 41, and imaging means 43 for imaging the workpiece held on the chuck table 41. The chuck table 41 has an upper surface as a holding surface for holding the workpiece thereon under suction. The chuck table 41 is movable both in the feeding direction (X direction) shown by an arrow X in FIG. 3 by feeding means (not shown) and in the indexing direction (Y direction) shown by an arrow Y in FIG. 3 by indexing means (not shown). The feeding means is an X moving mechanism for moving the chuck table 41 in the X direction, and the indexing means is a Y moving mechanism for moving the chuck table 41 in the Y direction perpendicular to the X direction.

The laser beam applying means 42 includes a cylindrical casing 421 extending in a substantially horizontal direction and focusing means 422 mounted on the front end of the casing 421 for focusing a pulsed laser beam and applying it to the workpiece held on the chuck table 41. The imaging means 43 is mounted on a front end portion of the casing 421 constituting the laser beam applying means 42. The imaging means 43 includes an ordinary imaging device (charge-coupled device: CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 43 is transmitted to control means (not shown).

Figure 3:
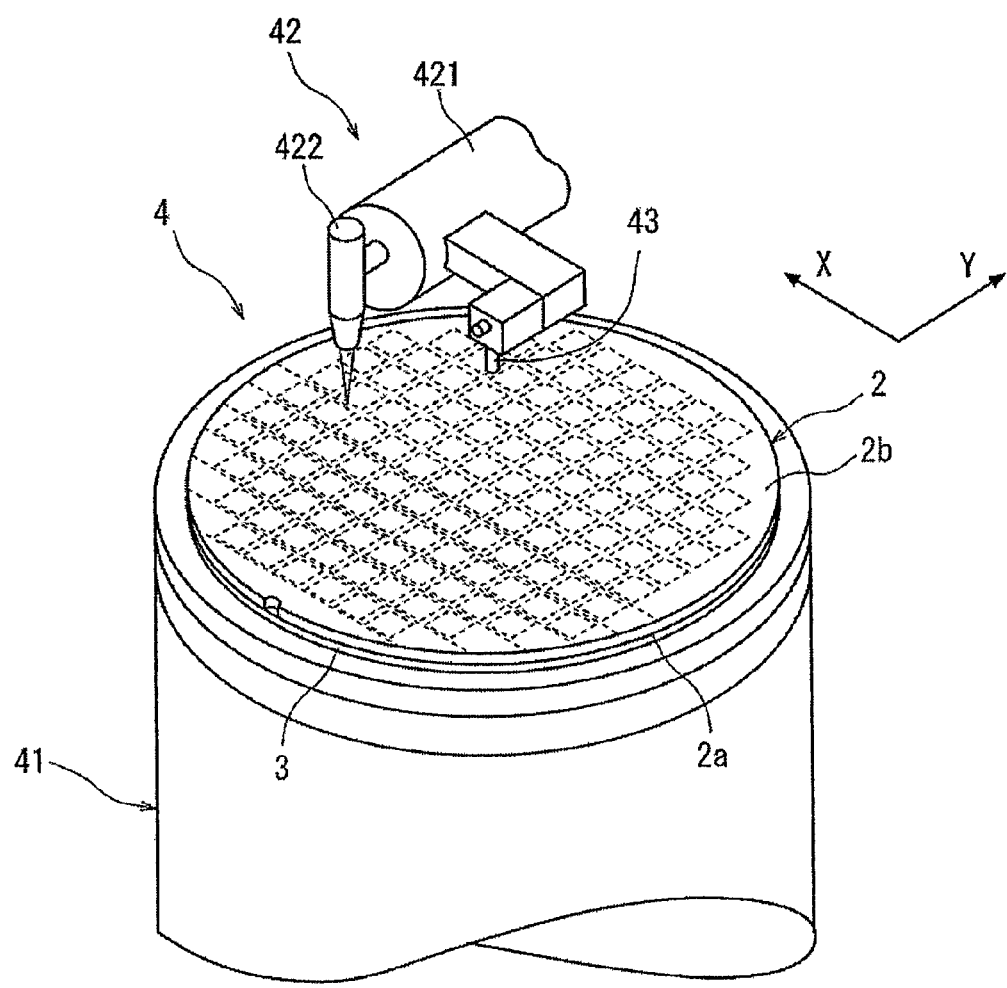
FIG. 3 is a perspective view of an essential part of a laser processing apparatus for performing a first modified layer forming step and a second modified layer forming step.

The first modified layer forming step using the laser processing apparatus 4 mentioned above will now be described with reference to FIG. 3 and FIGS. 4A to 4C. The semiconductor wafer 2 processed by the protective member attaching step is first placed on the chuck table 41 of the laser processing apparatus 4 shown in FIG. 3 in the condition where the protective tape 3 attached to the front side 2a of the semiconductor wafer 2 is in contact with the upper surface of the chuck table 41 as shown in FIG. 3. Thereafter, suction means (not shown) is operated to hold the semiconductor wafer 2 through the protective tape 3 on the chuck table 41 under suction (wafer holding step). Accordingly, the back side 2b of the semiconductor wafer 2 held on the chuck table 41 is oriented upward. Thereafter, the chuck table 41 holding the semiconductor wafer 2 is moved to a position directly below the imaging means 43 by operating the feeding means (not shown).

In the condition where the chuck table 41 is positioned directly below the imaging means 43, an alignment operation is performed by the imaging means 43 and the control means (not shown) to detect a subject area of the semiconductor wafer 2 to be laser-processed. More specifically, the imaging means 43 and the control means perform image processing such as pattern matching for making the alignment of the division lines 21 extending in a first direction and the focusing means 422 of the laser beam applying means 42 for applying the laser beam to the semiconductor wafer 2 along the division lines 21, thus performing the alignment of a laser beam applying position (alignment step). Similarly, the alignment of a laser beam applying position is performed for the other division lines 21 extending in a second direction perpendicular to the first direction on the semiconductor wafer 2. Although the front side 2a of the semiconductor wafer 2 where the division lines 21 are formed is oriented downward, the division lines 21 can be imaged from the back side 2b of the semiconductor wafer 2 because the imaging means 43 includes the infrared light applying means for applying infrared light, the optical system for capturing the infrared light, and the imaging device (infrared CCD) for outputting an electrical signal corresponding to the infrared light.

Figure 4A:
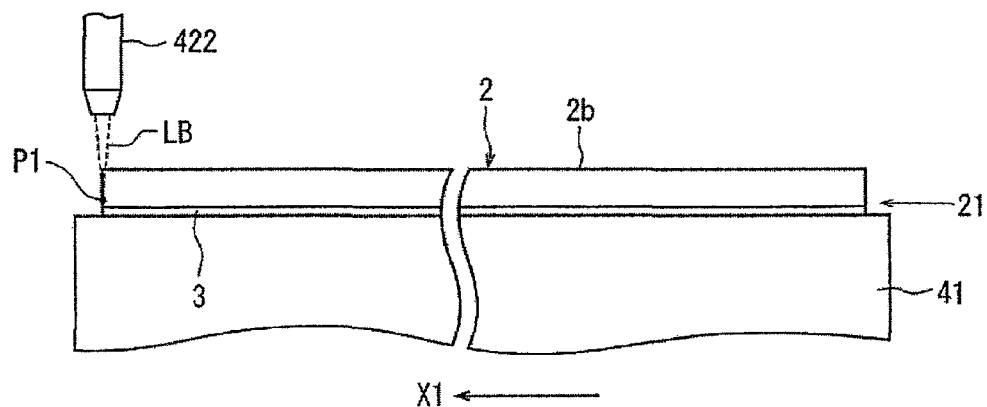
FIGS. 4A to 4C are sectional views showing the first modified layer forming step.
Figure 4B:
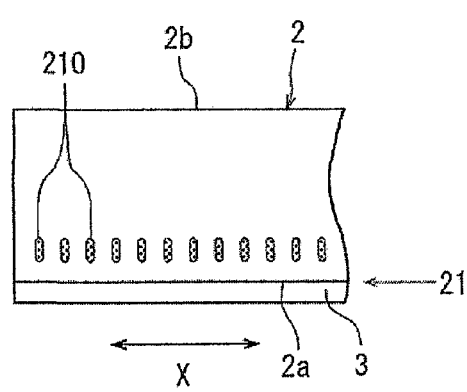
Figure 4C:
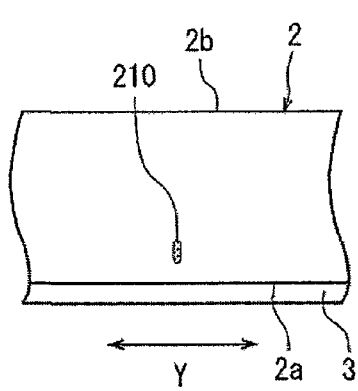

After performing the alignment step mentioned above to detect all the division lines 21 of the semiconductor wafer 2 held on the chuck table 41, the chuck table 41 is moved to a laser beam applying area where the focusing means 422 of the laser beam applying means 42 is located as shown in FIG. 4A, thereby positioning a predetermined one of the division lines 21 extending in the first direction directly below the focusing means 422. At this time, one end (left end as viewed in FIG. 4A) of the predetermined division line 21 is positioned directly below the focusing means 422 as shown in FIG. 4A. Further, the focal point P1 of a pulsed laser beam LB to be applied from the focusing means 422 is set at a position above the front side 2a (lower surface) of the semiconductor wafer 2 by 70 μm, for example, toward the back side 2b (upper surface). Thereafter, the pulsed laser beam LB having a transmission wavelength to the semiconductor wafer 2 (silicon wafer) is applied from the focusing means 422 to the semiconductor wafer 2, and the chuck table 41 is moved in the direction shown by an arrow X1 in FIG. 4A at a predetermined feed speed (first modified layer forming step). When the other end (right end as viewed in FIG. 4A) of the predetermined division line 21 reaches the position directly below the focusing means 422, the application of the pulsed laser beam LB is stopped and the movement of the chuck table 41 is also stopped. As a result, a first modified layer 210 is sequentially formed inside the semiconductor wafer 2 along the predetermined division line 21 as shown in FIG. 4B. The first modified layer 210 is composed of a plurality of modified spots arranged in line at given intervals. FIG. 4C is a sectional view corresponding to FIG. 4B, as taken along the Y direction perpendicular to the X direction.

For example, the first modified layer forming step mentioned above is performed under the following processing conditions.

Light source: YAG pulsed laser
Wavelength: 1342 nm
Repetition frequency: 90 kHz
Average power: 1.7 W
Focused spot diameter: 1 μm
Work feed speed: 700 mm/second By performing the first modified layer forming step under the above processing conditions, the first modified layer 210 having a thickness of approximately 40 μm is formed inside the semiconductor wafer 2 along the predetermined division line 21. After performing the first modified layer forming step along the predetermined division line 21, the chuck table 41 is moved in the Y direction by the pitch of the division lines 21 by operating the indexing means (not shown) (indexing step) to similarly perform the first modified layer forming step along the next division line 21 extending in the first direction. Thereafter, the first modified layer forming step is similarly performed along all of the other division lines 21 extending in the first direction. Thereafter, the chuck table 41 is rotated 90 degrees to similarly perform the first modified layer forming step along all of the other division lines 21 extending in the second direction perpendicular to the first direction.

Figure 5A:
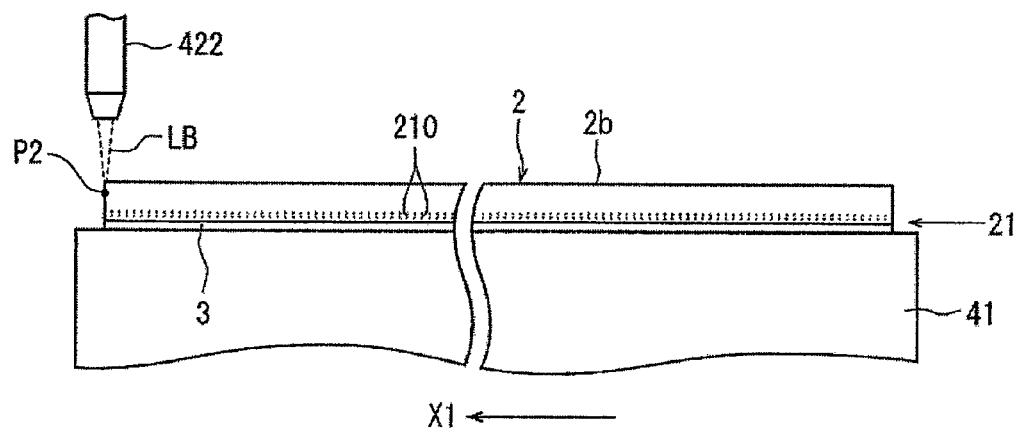
FIGS. 5A to 5C are sectional views showing the second modified layer forming step.
Figure 5B:
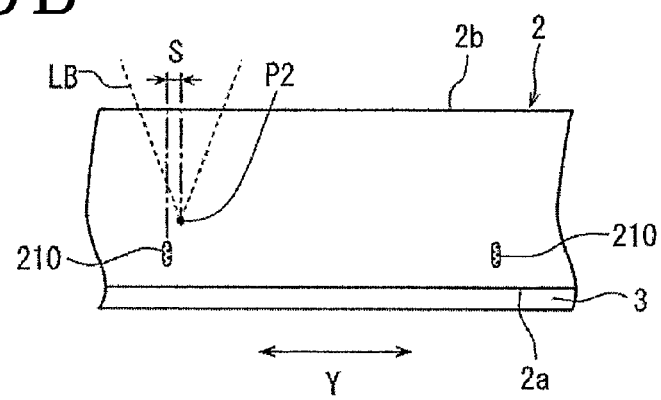

After performing the first modified layer forming step mentioned above, a second modified layer forming step is performed in such a manner that the focal point of the laser beam is set adjacent to the first modified layer 210 thereabove toward the back side 2b, and the laser beam is next applied along each division line 21 to thereby form a second modified layer for growing a crack from the first modified layer 210 toward the front side 2a. This second modified layer forming step is performed in the following manner. After performing the first modified layer forming step, the chuck table 41 is moved to the laser beam applying area where the focusing means 422 of the laser beam applying means 42 is located. More specifically, as shown in FIG. 5A, one end (left end as viewed in FIG. 5A) of the predetermined division line 21 is positioned directly below the focusing means 422 of the laser beam applying means 42. Thereafter, the focal point P2 of the pulsed laser beam LB to be applied from the focusing means 422 is set at a position above the front side 2a (lower surface) of the semiconductor wafer 2 by 150 μm, for example, toward the back side 2b (upper surface). Furthermore, the chuck table 41 is slightly moved in the Y direction to horizontally displace the focal point P2 from the above position (the Y position of the focal point P1 of the laser beam LB) to the right side in the Y direction as viewed in FIG. 5B by a predetermined offset amount (S).

Figure 5C:
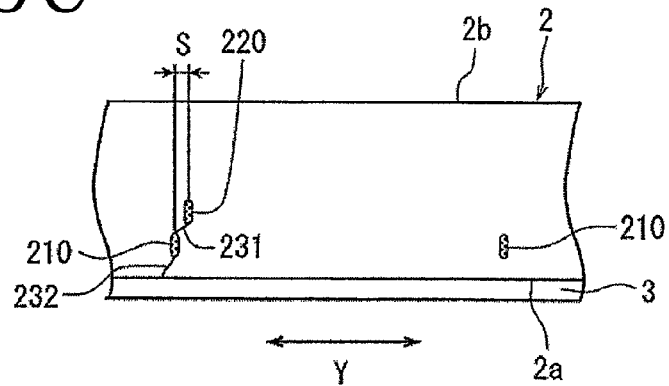

Thereafter, the pulsed laser beam LB having a transmission wavelength to the semiconductor wafer 2 (silicon wafer) is applied from the focusing means 422 to the semiconductor wafer 2, and the chuck table 41 is moved in the direction shown by an arrow X1 in FIG. 5A at a predetermined feed speed (second modified layer forming step). When the other end (right end as viewed in FIG. 5A) of the predetermined division line 21 reaches the position directly below the focusing means 422, the application of the pulsed laser beam LB is stopped and the movement of the chuck table 41 is also stopped. The processing conditions of the second modified layer forming step may be identical with the processing conditions of the first modified layer forming step. As a result, a second modified layer 220 having a thickness of approximately 40 μm is formed inside the semiconductor wafer 2 obliquely above the first modified layer 210 as shown in FIG. 5C. More specifically, the Y position of the second modified layer 220 is shifted from the Y position of the first modified layer 210 by the offset amount (S) as shown in FIG. 5C. Furthermore, a crack 231 grows from the second modified layer 220 toward the first modified layer 210, and a crack 232 grows from the first modified layer 210 toward the front side 2a of the semiconductor wafer 2 as shown in FIG. 5C. The crack 232 grows opposite to the direction of displacement of the focal point P1 to the focal point P2 by the offset amount (S).

After performing the second modified layer forming step along the predetermined division line 21, the chuck table 41 is moved in the Y direction by the pitch of the division lines 21 by operating the indexing means (not shown) (indexing step) to similarly perform the second modified layer forming step along the next division line 21 extending in the first direction. Thereafter, the second modified layer forming step is similarly performed along all of the other division lines 21 extending in the first direction. Thereafter, the chuck table 41 is rotated 90 degrees to similarly perform the second modified layer forming step along all of the other division lines 21 extending in the second direction perpendicular to the first direction.

The relation between the offset amount (S) and a breaking line extending along each division line 21 will be hereinafter described in detail, wherein the offset amount (S) is the difference between the Y position of the first modified layer 210 formed in the first modified layer forming step (the Y position of the focal point P1 of the pulsed laser beam LB in the first modified layer forming step) and the Y position of the focal point P2 of the pulsed laser beam LB in the second modified layer forming step.

After performing the second modified layer forming step mentioned above, a back grinding step is performed in such a manner that the back side 2b of the semiconductor wafer 2 is ground to reduce the thickness of the semiconductor wafer 2 to a predetermined thickness and simultaneously divide the semiconductor wafer 2 into the individual device chips in the condition where the protective tape 3 as the protective member is attached to the front side 2a of the semiconductor wafer 2. This back grinding step is performed by using a grinding apparatus 5 shown in FIG. 6A. The grinding apparatus 5 shown in FIG. 6A includes a chuck table 51 as workpiece holding means for holding a workpiece and grinding means 52 for grinding the workpiece held on the chuck table 51. The chuck table 51 has an upper surface as a holding surface for holding the workpiece thereon under suction. The chuck table 51 is rotatable in the direction shown by an arrow 51a in FIG. 6A by a rotational drive mechanism (not shown). The grinding means 52 includes a spindle housing 53, a spindle 54 rotatably supported to the spindle housing 53 and adapted to be rotated by a rotational drive mechanism (not shown), a mounter 55 fixed to the lower end of the spindle 54, and a grinding wheel 56 mounted on the lower surface of the mounter 55. The grinding wheel 56 is composed of an annular base 57 and a plurality of abrasive members 58 fixed to the lower surface of the annular base 57 so as to be annularly arranged along the outer circumference thereof. The annular base 57 is mounted on the lower surface of the mounter 55 by a plurality of fastening bolts 59.

Figure 6A:
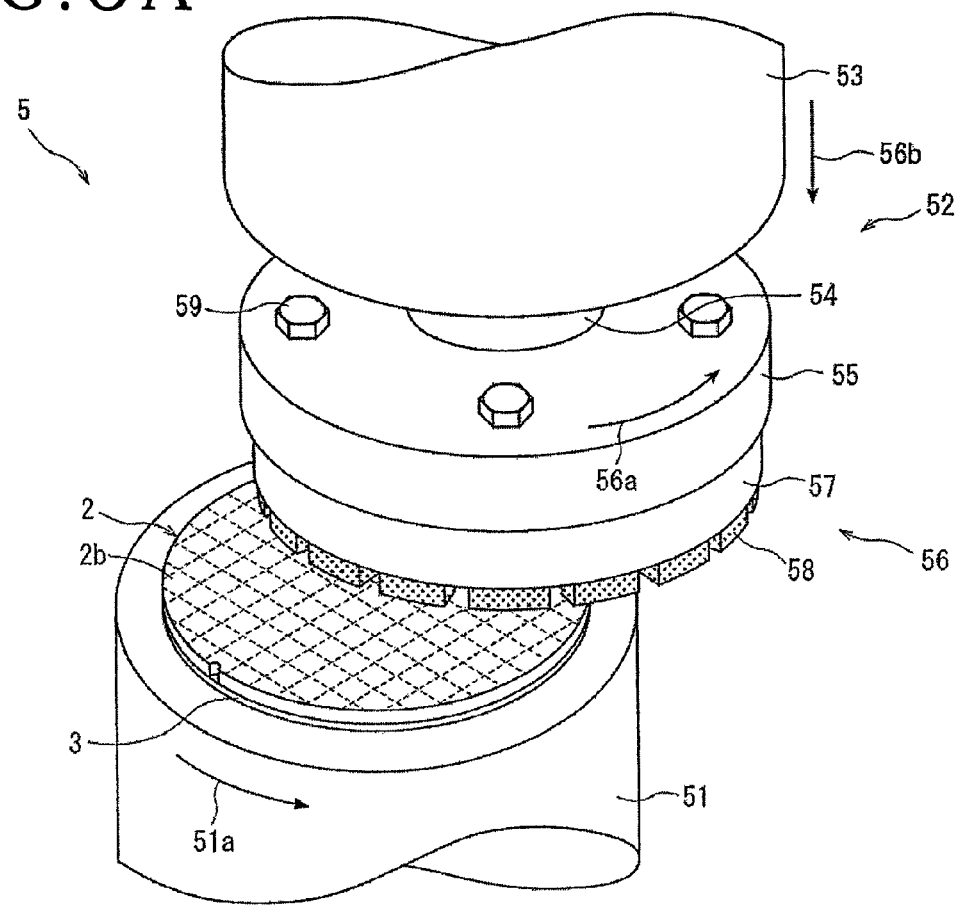
FIG. 6A is a perspective view showing a back grinding step.

In performing the back grinding step by using the grinding apparatus 5 mentioned above, the semiconductor wafer 2 is placed on the chuck table 51 in the condition where the protective tape 3 attached to the front side 2a of the semiconductor wafer 2 is in contact with the upper surface (holding surface) of the chuck table 51 as shown in FIG. 6A. Thereafter, suction means (not shown) is operated to hold the semiconductor wafer 2 through the protective tape 3 on the chuck table 51 under suction (wafer holding step).

Figure 6B:
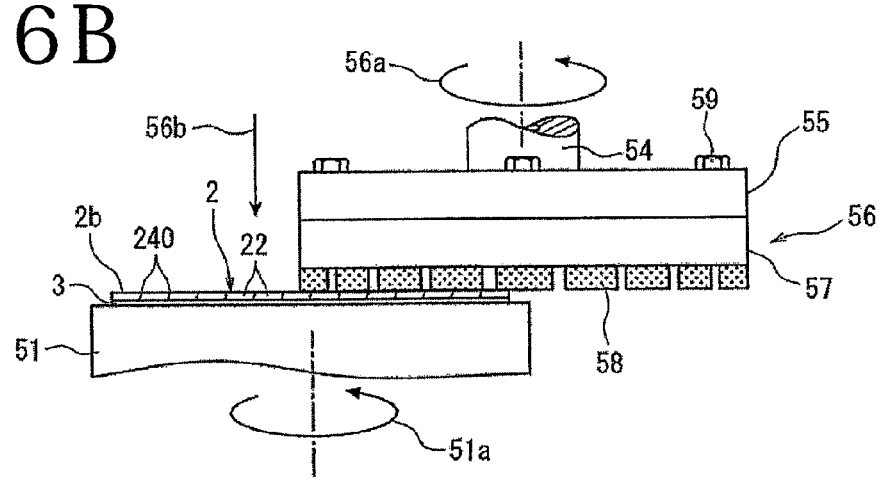
FIG. 6B is a side view showing the back grinding step.

Accordingly, the semiconductor wafer 2 is held through the protective tape 3 on the chuck table 51 under suction in the condition where the back side 2b of the semiconductor wafer 2 is oriented upward. After holding the semiconductor wafer 2 through the protective tape 3 on the chuck table 51 under suction as mentioned above, the chuck table 51 is rotated in the direction of the arrow 51a in FIG. 6A at 300 rpm, for example. At the same time, the grinding wheel 56 of the grinding means 52 is also rotated in the direction shown by an arrow 56a in FIG. 6A at 3400 rpm, for example. Thereafter, the grinding means 52 is lowered to bring the abrasive members 58 of the grinding wheel 56 into contact with the back side 2b (work surface) of the semiconductor wafer 2 as shown in FIG. 6B. Thereafter, the grinding wheel 56 is fed (lowered) in the direction shown by an arrow 56b in FIGS. 6A and 6B (in the direction perpendicular to the holding surface of the chuck table 51) by a predetermined amount at a feed speed of 1 μm/second, for example. As a result, the back side 2b of the semiconductor wafer 2 is ground to reduce the thickness of the semiconductor wafer 2 to a predetermined thickness (e.g., 150 μm). At the same time, a breaking line 240 is formed along each division line 21 by the formation of the crack 232 extending from the first modified layer 210 toward the front side 2a of the semiconductor wafer 2, thereby reducing the strength of each division line 21. Accordingly, the semiconductor wafer 2 is divided into the individual devices (device chips) 22 along each breaking line 240. At this time, the direction of growth of the crack 232 for forming the breaking line 240 is defined by the formation of the second modified layer 220, so that meandering of the breaking line 240 exposed to the front side 2a of the semiconductor wafer 2 can be suppressed.

Figure 7:
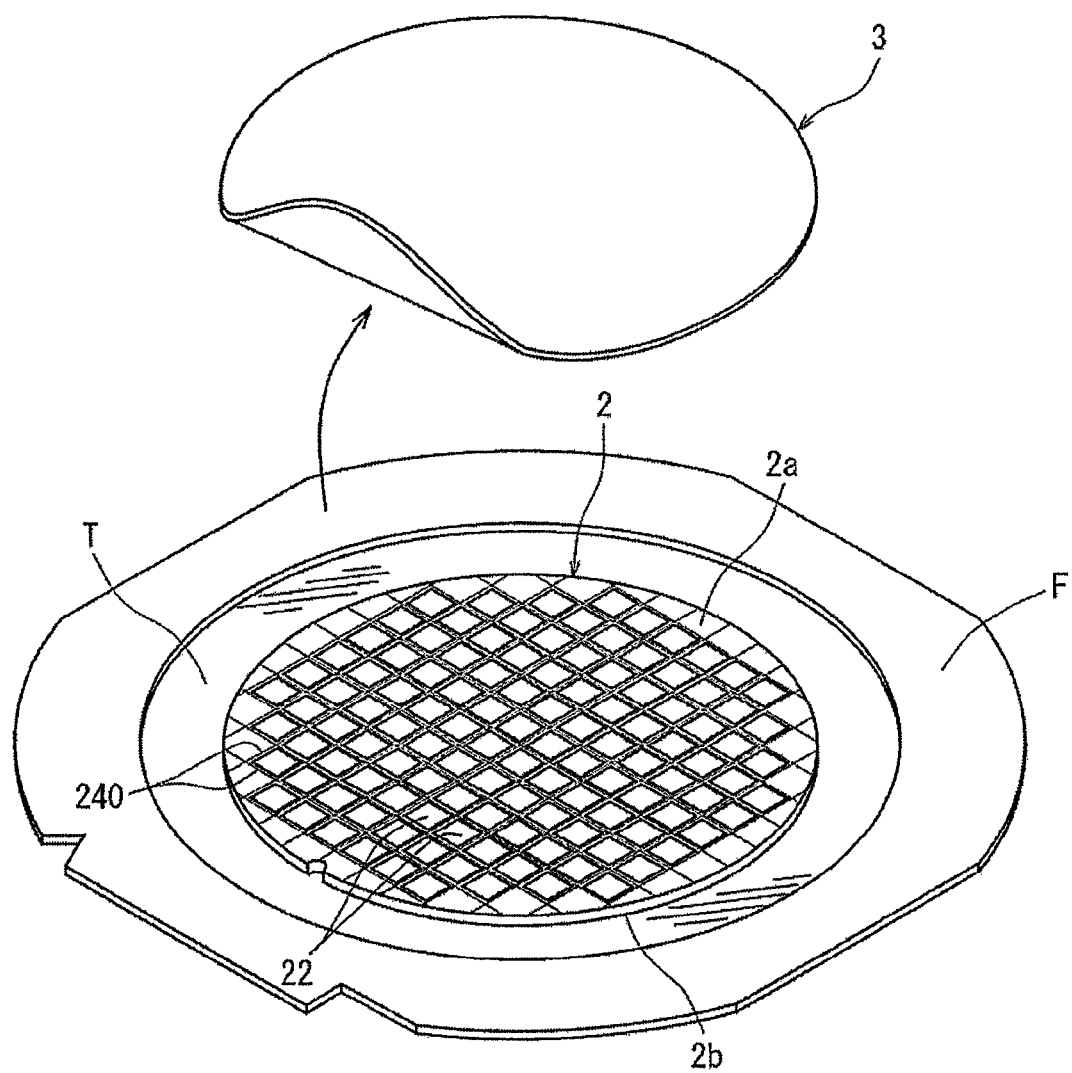
FIG. 7 is a perspective view showing a wafer supporting step of supporting the semiconductor wafer through a dicing tape to an annular frame.

After performing the back grinding step mentioned above, a wafer supporting step is performed in such a manner that a dicing tape is attached to the back side 2b of the semiconductor wafer 2 and the peripheral portion of the dicing tape is supported to an annular frame. More specifically, as shown in FIG. 7, a dicing tape T is preliminarily supported at its peripheral portion to an annular frame F having an inside opening, so that the inside opening of the annular frame F is closed by the dicing tape T. In this condition, the back side 2b of the semiconductor wafer 2 processed by the back grinding step is attached to the front side (adhesive side) of the dicing tape T exposed to the inside opening of the annular frame F. Further, the protective tape 3 is next peeled from the front side 2a of the semiconductor wafer 2. Accordingly, the semiconductor wafer 2 is attached to the front side of the dicing tape T in the condition where the front side 2a of the semiconductor wafer 2 is oriented upward, or exposed.

After performing the wafer supporting step mentioned above, a pickup step is performed to pick up each of the device chips from the dicing tape T.

The relation between the offset amount (S) and the breaking line 240 extending along each division line 21 will now be described on the basis of test results obtained by the present inventor, wherein the offset amount (S) is the difference between the Y position of the first modified layer 210 formed in the first modified layer forming step (the Y position of the focal point P1 of the pulsed laser beam LB in the first modified layer forming step) and the Y position of the focal point P2 of the pulsed laser beam LB in the second modified layer forming step.

Figure 8:
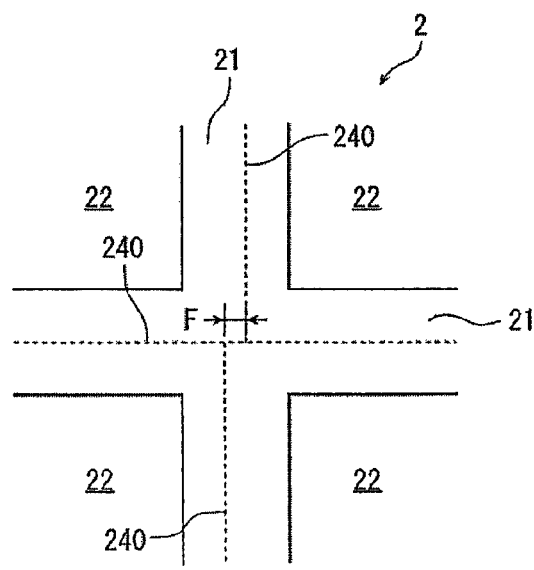
FIG. 8 is a plan view for illustrating a shift amount at the intersections of breaking lines extending along division lines formed on the semiconductor wafer.
Figure 9:
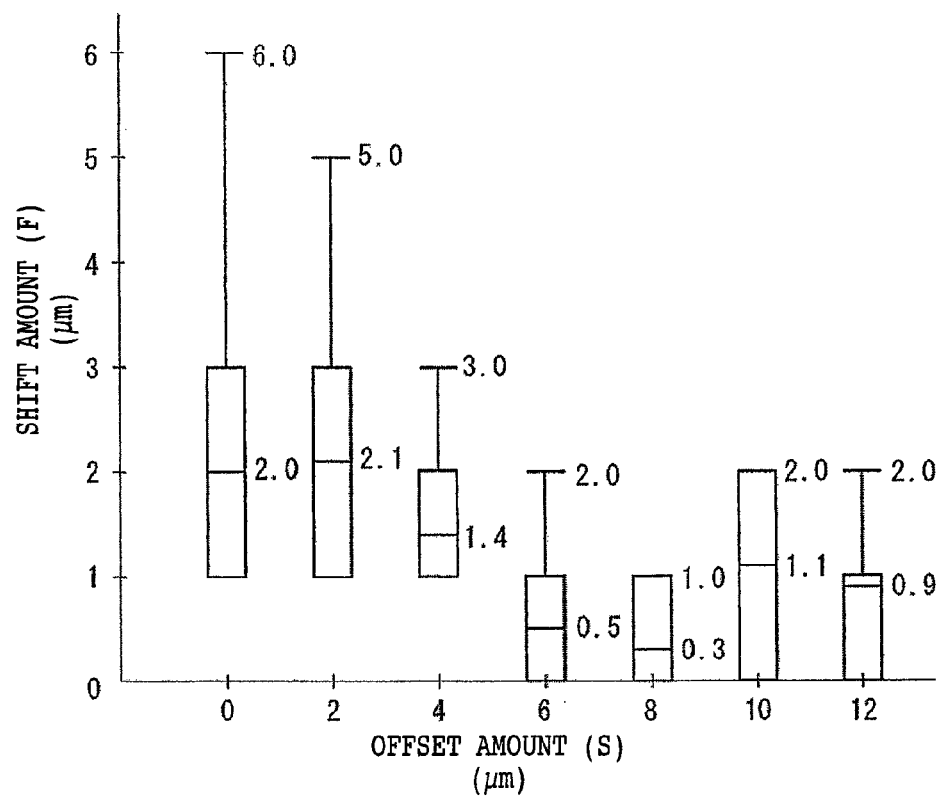
FIG. 9 is a graph showing test results obtained by examining the shift amount at the intersections of the breaking lines formed on the semiconductor wafer by the wafer processing method of the present invention.
Figure 10:
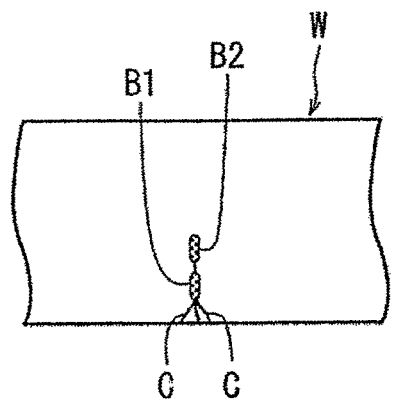
FIG. 10 is a schematic sectional view showing a modified layer forming step in the conventional wafer processing method.

The present inventor examined a shift amount (F) at the intersections of the breaking lines 240 extending along the division lines 21 as shown in FIG. 8, wherein the shift amount (F) was examined at 100 points under the following conditions. After setting the offset amount (S) to 0 μm, 2 μm, 4 μm, 6 μm, 8 μm, 10 μm, and 12 μm, the second modified layer forming step was performed to determine the maximum value for the shift amount (F), the average value for the shift amount (F), and the shift range including 70% of the shift amount (F) for each offset amount (S), then obtaining the test results shown in FIG. 9. In FIG. 9, the horizontal axis represents the offset amount (S) (μm) and the vertical axis represents the shift amount (F) (μm).

As apparent from the test results shown in FIG. 9, the following points can be said.

(1) In the case that the offset amount (S) is 0 μm (i.e., in the case that the focal point P2 of the pulsed laser beam LB in the second modified layer forming step was set directly above the first modified layer 210 formed in the first modified layer forming step), the maximum value for the shift amount (F) is as large as 6 μm and the average value for the shift amount (F) is also as large as 2.0 μm. Further, the range including 70% of the shift amount (F) is also as large as 2 μm. Thusly, in the case that the offset amount (S) is 0 μm, the shift amount (F) at the intersections of the breaking lines 240 is large.

(2) In the case that the offset amount (S) is 2 μm, the maximum value for the shift amount (F) is 5 μm, which is less than that in the case that the offset amount (S) is 0 μm. Further, the average value for the shift amount (F) is as large as 2.1 μm, and the range including 70% of the shift amount (F) is also as large as 2 μm.

(3) In the case that the offset amount (S) is 4 μm, the maximum value for the shift amount (F) is 3 μm, which is considerably less than that in the case that the offset amount (S) is 2 μm. Further, the average value for the shift amount (F) is also reduced to 1.4 μm, and the range including 70% of the shift amount (F) is also reduced to 1 μm.

(4) In the case that the offset amount (S) is 6 μm, the maximum value for the shift amount (F) is reduced to 2 μm. Further, the average value for the shift amount (F) is also reduced to 0.5 μm, and the range including 70% of the shift amount (F) is 1 μm. Accordingly, in the case that the offset amount (S) is 6 μm, the semiconductor wafer 2 can be divided with high accuracy.

(5) In the case that the offset amount (S) is 8 μm, the maximum value for the shift amount (F) is reduced to 1 μm. Further, the average value for the shift amount (F) is also reduced to 0.3 μm, and the range including 70% of the shift amount (F) is 1 μm. Thus, in the case that the offset amount (S) is 8 μm, all the values for the shift amount (F) fall in the range of 1 μm. Accordingly, as compared with the case that the offset amount (S) is 6 μm, the semiconductor wafer 2 can be divided with higher accuracy.

(6) In the case that the offset amount (S) is 10 μm, the maximum value for the shift amount (F) is 2 μm, which is equal to that in the case that the offset amount (S) is 6 μm. However, the average value for the shift amount (F) is 1.1 μm, which is higher than that in the case that the offset amount (S) is 6 μm. Further, the range including 70% of the shift amount (F) is increased to 2 μm.

(7) In the case that the offset amount (S) is 12 μm, the maximum value for the shift amount (F) is 2 μm, which is equal to that in the case that the offset amount (S) is 10 μm. Further, the average value for the shift amount (F) is reduced to 0.9 μm, and the range including 70% of the shift amount (F) is greatly reduced to 1 μm.

In summary, the test results obtained by the present inventor show that by setting the focal point P2 of the laser beam at a position displaced in the Y direction by a predetermined offset amount (S) from the position directly above the first modified layer 210, in performing the second modified layer forming step, the maximum value for the shift amount (F) at the intersections of the breaking lines 240 can be reduced as compared with the case that the offset amount (S) is 0 μm. Further, the range including 70% of the shift amount (F) is also reduced. In particular, when the offset amount (S) is in the range of 6 to 8 μm, the average value for the shift amount (F) is 0.5 to 0.3 μm, and at least 70% of the shift amount (F) falls in the range of 1 μm. Accordingly, the offset amount (S) is preferably set to 6 to 8 μm in the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual device chips along a plurality of crossing division lines formed on a front side of said wafer, the front side of said wafer being partitioned by said division lines to define a plurality of separate regions where a plurality of devices are formed, said individual device chips corresponding to said respective devices, said wafer processing method comprising:
   a first modified layer forming step of applying a laser beam having a transmission wavelength to said wafer from a back side thereof along each division line in the condition where the focal point of said laser beam is set inside said wafer near the front side thereof, thereby forming a first modified layer inside said wafer along each division line; and
   a second modified layer forming step of applying said laser beam to said wafer from the back side thereof along each division line in the condition where the focal point of said laser beam is set adjacent to said first modified layer thereabove toward the back side of said wafer after performing said first modified layer forming step, thereby forming a second modified layer for growing a crack from said first modified layer toward the front side of said wafer;
   wherein the focal point of said laser beam in said second modified layer forming step is set at a position slightly displaced by a predetermined offset amount from the position directly above said first modified layer in a Y direction perpendicular to an X direction corresponding to the scanning direction of said laser beam, thereby defining the direction of extension of said crack growing from said first modified layer toward the front side of said wafer.

2. The wafer processing method according to claim 1, further comprising:
   a back grinding step of grinding the back side of said wafer in the condition where a protective member is attached to the front side of said wafer, after performing said second modified layer forming step, thereby reducing the thickness of said wafer to a predetermined thickness and simultaneously dividing said wafer into said individual device chips.

3. The wafer processing method according to claim 1, wherein said offset amount is set to 6 to 8 μm.

* * * * *